US012543429B2

(12) United States Patent
Park et al.

(10) Patent No.: US 12,543,429 B2
(45) Date of Patent: Feb. 3, 2026

(54) ORGANIC LIGHT-EMITTING DIODE DISPLAY DEVICE INCLUDING A PLURALITY OF STACKS

(71) Applicant: LG Display Co., Ltd., Seoul (KR)

(72) Inventors: Jin-Hwan Park, Paju-si (KR); Min-Gyu Lee, Paju-si (KR); Jung-Shik Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 494 days.

(21) Appl. No.: 17/537,251

(22) Filed: Nov. 29, 2021

(65) Prior Publication Data

US 2022/0199929 A1    Jun. 23, 2022

(30) Foreign Application Priority Data

Dec. 23, 2020  (KR) .................. 10-2020-0182430

(51) Int. Cl.
*H10K 50/13* (2023.01)
*H10K 50/11* (2023.01)
(Continued)

(52) U.S. Cl.
CPC ............ *H10K 50/13* (2023.02); *H10K 50/11* (2023.02); *H10K 50/12* (2023.02); *H10K 50/19* (2023.02); *H10K 59/32* (2023.02); *H10K 2101/10* (2023.02)

(58) Field of Classification Search
CPC .... H10K 50/19; H10K 50/13; H10K 2101/10; H10K 2101/40
See application file for complete search history.

(56) References Cited

U.S. PATENT DOCUMENTS 9,281,487 B2    3/2016  Kim et al.
9,825,245 B2    11/2017 Kam et al.
(Continued)

FOREIGN PATENT DOCUMENTS

KR    10-2014-0087661 A    7/2014
KR    10-2015-0015647 A    2/2015
(Continued)

OTHER PUBLICATIONS

Zhang, Lee, and Forrest. "Tenfold Increase in the Lifetime of Blue Phosphorescent Organic Light-Emitting Diodes" Nature Communications DOI: 10.1038/ncomms6008. p. 3 (Year: 2014).*
(Continued)

*Primary Examiner* — Chad M Dicke
*Assistant Examiner* — Jeremy Daniel Watts
(74) *Attorney, Agent, or Firm* — Fenwick & West LLP

(57) ABSTRACT

An organic light-emitting diode display device includes a first electrode, a first stack emitting blue light, a first charge generation layer on the first stack; a second stack emitting yellow-green light, a second charge generation layer on the second stack, a third stack emitting blue light, and a second electrode on the third stack, wherein at least one of the first stack and the third stack further emits red light, wherein the at least one of the first stack and the third stack includes a first red emitting material layer and a blue emitting material layer, and wherein each of the first red emitting material layer and the blue emitting material layer includes a host and a dopant, and a T1 energy of the host of the blue emitting material layer is greater than a T1 energy of the dopant of the first red emitting material layer.

19 Claims, 7 Drawing Sheets

(51) Int. Cl.
*H10K 50/12* (2023.01)
*H10K 50/19* (2023.01)
*H10K 59/32* (2023.01)
*H10K 101/10* (2023.01)

(56) References Cited

U.S. PATENT DOCUMENTS

| | | | |
|---|---|---|---|
| 10,096,791 | B2 | 10/2018 | Kam et al. |
| 11,094,908 | B2 | 8/2021 | Kwon et al. |
| 2011/0248249 | A1* | 10/2011 | Forrest ............... H10K 50/11 257/40 |
| 2013/0153868 | A1* | 6/2013 | Wu ................. H10K 50/131 257/40 |
| 2015/0034923 | A1* | 2/2015 | Kim ................ H10K 50/131 257/40 |
| 2016/0149151 | A1 | 5/2016 | Kam et al. |
| 2017/0155071 | A1* | 6/2017 | Han .................... H10K 59/32 |
| 2018/0053908 | A1 | 2/2018 | Kam et al. |
| 2019/0006631 | A1* | 1/2019 | Kim ................ H10K 50/131 |
| 2019/0229271 | A1* | 7/2019 | Lee .................. H10K 85/6572 |
| 2020/0203649 | A1 | 6/2020 | Kwon et al. |
| 2021/0210707 | A1* | 7/2021 | Levermore ........... H10K 50/19 |
| 2022/0059767 | A1* | 2/2022 | Kang ............... H10K 85/6572 |
| 2022/0199911 | A1* | 6/2022 | Lee ................. H10K 85/615 |

FOREIGN PATENT DOCUMENTS

| | | |
|---|---|---|
| KR | 10-2016-0062798 A | 6/2016 |
| KR | 10-2016-0074376 A | 6/2016 |
| KR | 10-2020-0001045 A | 1/2020 |
| KR | 10-2020-0023863 A | 3/2020 |
| KR | 10-2020-0076969 A | 6/2020 |

OTHER PUBLICATIONS

Kwon et al. "Bis(4-(4,5-diphenyl-4H-1,2,4-triazol-3-yl)phenyl)-dimethylsilane as Electron-Transport Material for Deep Blue Phosphorescent OLEDs" 2010, J. Phys. Chem. Lett., vol. 1, pp. 295-299, teaching T1 energy of blue host (Year: 2010).*

Jang-Hyuk Kwon and Ramchandra Pode (2011). High Efficiency Red Phosphorescent Organic Light-Emitting Diodes with Simple Structure, Organic Light Emitting Diode—Material, Process and Devices, Prof. Seung Hwan Ko (Ed.), ISBN: 978-953-307-273-9, teaching T1 energy of red dopant (Year: 2011).*

Wang, J.; Yin, J.; Li, X.; Wang, Z.; Wu, R.; Zhou, L. Highly Efficient Solution-Processed Blue Phosphorescent Organic Light-Emitting Diodes Based on Co-Dopant and Co-Host System. Molecules 2022, 27, 6882. https://doi.org/10.3390/molecules27206882 (Year: 2022).*

Pode, Ramchandra. High Efficiency Red Phosphorescent Organic Light-Emitting Diodes with Simple Structure. Kyung Hee University Korea (Year: 2009).*

Korean Intellectual Property Office, Office Action, Korean Patent Application No. 10-2020-0182430, Jul. 29, 2024, 11 pages.

* cited by examiner

ORGANIC LIGHT-EMITTING DIODE DISPLAY DEVICE INCLUDING A PLURALITY OF STACKS

CROSS-REFERENCE TO RELATED APPLICATIONS

The present application claims priority from and the benefit under 35 U.S.C § 119(a) of Republic of Korea Patent Application No. 10-2020-0182430 filed on Dec. 23, 2020, which is hereby incorporated by reference in its entirety.

BACKGROUND

Field of the Disclosure

The present disclosure relates to an organic light-emitting diode display device, and more particularly, to an organic light-emitting diode display device with improved luminous efficiency.

Discussion of the Related Art

Recently, flat panel display devices have been widely developed and applied to various fields because of their thin profile, light weight, and low power consumption.

Among the flat panel display devices, organic light-emitting diode display devices emit light due to the radiative recombination of an exciton after forming the exciton from an electron and a hole by injecting charges into a light-emitting layer between a cathode for injecting electrons and an anode for injecting holes in a light-emitting diode.

In recent, white organic light-emitting diode display devices have been researched and developed to be applied to a high-definition small display device, which is used for virtual reality (VR) or augmented reality (AR) devices.

The white organic light-emitting diode display device has a tandem structure including a plurality of stacks (light-emitting units). The tandem structure has advantages of low driving voltage, high luminous efficiency, and easy color control compared to a single structure including one stack.

The white organic light-emitting diode display device having the tandem structure includes a plurality of emitting material layers emitting different colors, and in order to implement the optimum luminous efficiencies for respective colors, the plurality of emitting material layers are disposed in the plurality of stacks, respectively.

The plurality of emitting material layers may have different properties. Therefore, the luminous efficiencies of the respective colors are also different, and there is a problem that the overall luminous efficiency is lowered because the luminous efficiency of the specific color is low.

SUMMARY

Accordingly, the present disclosure is directed to an organic light-emitting diode display device that substantially obviates one or more of the problems due to limitations and disadvantages of the related art.

An object of the present disclosure is to provide an organic light-emitting diode display device with the improved the luminous efficiency.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an organic light-emitting diode display device that includes a first electrode, a first stack on the first electrode and emitting blue light, a first charge generation layer on the first stack, a second stack on the first charge generation layer and emitting yellow-green light, a second charge generation layer on the second stack, a third stack on the second charge generation layer and emitting blue light, and a second electrode on the third stack, wherein at least one of the first stack and the third stack further emits red light, wherein the at least one of the first stack and the third stack includes a first red emitting material layer and a blue emitting material layer, and wherein each of the first red emitting material layer and the blue emitting material layer includes a host and a dopant, and a T1 energy of the host of the blue emitting material layer is greater than a T1 energy of the dopant of the first red emitting material layer.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION

Reference will now be made in detail to exemplary embodiments of the disclosure, examples of which are illustrated in the accompanying drawings.

An organic light-emitting diode display device according to an embodiment of the present disclosure includes a plurality of pixels to display an image, and each of the plurality of pixels includes first, second and third sub-pixels having different colors. A pixel region corresponding to each sub-pixel can have a configuration shown in FIG. 1.

Figure 1:
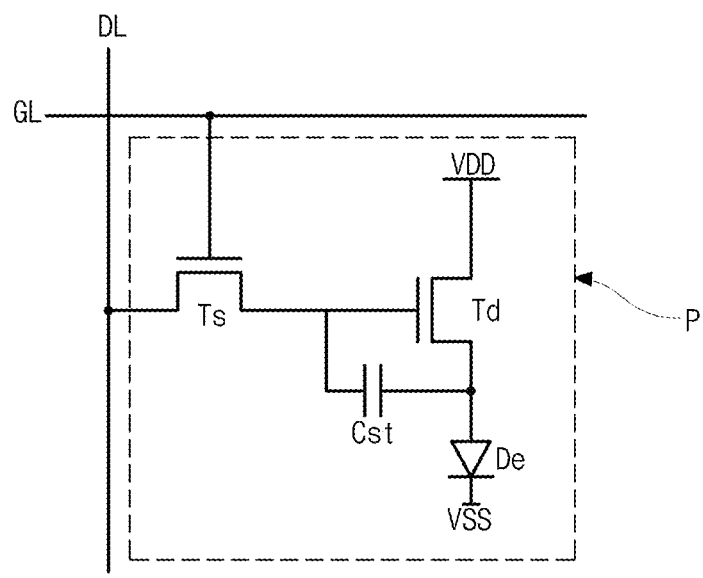
FIG. 1 is a circuit diagram of one pixel region of an organic light-emitting diode display device according to an embodiment of the present disclosure.

FIG. 1 is a circuit diagram of one pixel region of an organic light-emitting diode display device according to an embodiment of the present disclosure.

In FIG. 1, the organic light-emitting diode display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The organic light-emitting diode display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the organic light-emitting diode display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the organic light-emitting diode display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the organic light-emitting diode display device displays a different gray level with respect to the same data signal. This causes non-uniform luminance, thereby lowering the image quality of the organic light-emitting diode display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

In the organic light-emitting diode display device having the above-described configuration, the light-emitting diode of each sub-pixel emits white light, a color filter is further provided to correspond to each sub-pixel, and the white light selectively emitted from the sub-pixel passes through the corresponding color filter, thereby displaying a variety of color images. Various structures of the organic light-emitting diode display device according to the present disclosure including such a light-emitting diode will be described in detail with reference to accompanying drawings.

Figure 2:
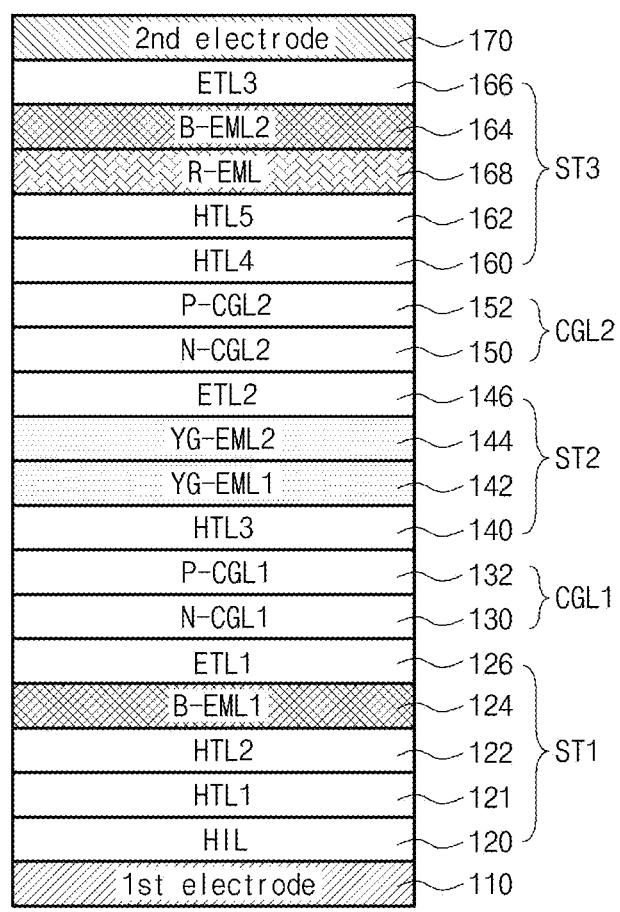
FIG. 2 is a schematic view of an organic light-emitting diode display device according to a first embodiment of the present disclosure.

FIG. 2 is a schematic view of an organic light-emitting diode display device according to a first embodiment of the present disclosure.

In FIG. 2, the organic light-emitting diode display device 100 according to the first embodiment of the present disclosure includes a first electrode 110, a first stack ST1, a first charge generation layer CGL1, a second stack ST2, a second charge generation layer CGL2, a third stack ST3, and a second electrode 170.

Here, the first stack ST1 emits blue light, the second stack ST2 emits yellow-green light, and the third stack ST3 emits blue light and red light. The red light may be in a wavelength range of 600 nm to 670 nm, the yellow-green light may be within a wavelength range of 500 nm to 580 nm, and the blue light may be within a wavelength range of 440 nm to 480 nm.

The first electrode 110 and the second electrode 170 can be an anode and a cathode, respectively. The first electrode 110 is formed of a conductive material having relatively high work function. For example, the first electrode 110 can be formed of a transparent conductive material such as indium tin oxide (ITO) or indium zinc oxide (IZO). On the other hand, the second electrode 170 is formed of a conductive material having relatively low work function. For example, the second electrode 170 can be formed of a metal material such as aluminum (Al), magnesium (Mg), silver (Ag), gold (Au), or their alloy.

The first stack ST1 for emitting blue light includes a hole injecting layer (HIL) 120, a first hole transporting layer (HTL1) 121, a second hole transporting layer (HTL2) 122, a first blue emitting material layer (B-EML1) 124, and a first electron transporting layer (ETL1) 126 sequentially from bottom.

The first charge generation layer CGL1 includes a first N-type charge generation layer (N-CGL1) 130 as a lower layer and a first P-type charge generation layer (P-CGL1) 132 as an upper layer. The first N-type charge generation layer 130 is disposed between the first electron transporting layer 126 of the first stack ST1 and the first P-type charge generation layer 132.

The second stack ST2 for emitting yellow-green light includes a third hole transporting layer (HTL3) 140, a first yellow-green emitting material layer (YG-EML1) 142, a second yellow-green emitting material layer (YG-EML2) 144, and a second electron transporting layer (ETL2) 146 sequentially from bottom.

The second charge generation layer CGL2 includes a second N-type charge generation layer (N-CGL2) 150 as a lower layer and a second P-type charge generation layer (P-CGL2) 152 as an upper layer. The second N-type charge generation layer 150 is disposed between the second electron transporting layer 146 of the second stack ST2 and the second P-type charge generation layer 152.

The third stack ST3 for emitting blue light and red light includes a fourth hole transporting layer (HTL4) 160, a fifth hole transporting layer (HTL5) 162, a red emitting material layer (R-EML) 168, a second blue emitting material layer (B-EML2) 164, and a third electron transporting layer (ETL3) 166 sequentially from bottom.

A total thickness of the first, second, and third stacks ST1, ST2, and ST3 and the first and second charge generation layers CGL1 and CGL2, that is, a distance between the first electrode 110 and the second electrode 170 can be about 4,000 Å to about 4,500 Å, but is not limited thereto.

Although not shown in the figure, the organic light-emitting diode display device 100 of the present disclosure can include a substrate comprising a plurality of sub-pixels expressing red, green and blue colors, the first electrode 110 can be disposed in each sub-pixel over the substrate, and the second electrode 170 can be disposed substantially all over the substrate.

In addition, a plurality of thin film transistors can be disposed under the first electrode 110 in each sub-pixel, and the first electrode 110 can be connected to a driving thin film transistor among the plurality of thin film transistors.

Further, a color filter layer and/or a color conversion layer can be disposed under the first electrode 110 or over the second electrode 170 corresponding to each sub-pixel.

The hole injecting layer 120 serves to inject holes, the first, second, third, fourth, and fifth hole transporting layers 121, 122, 140, 160, and 162 serve to transport holes, the first, second, and third electron transporting layers 126, 146, and 166 serve to transport electrons, the first and second N-type charge generation layers 130 and 150 serve to generate electrons, and the first and second P-type charge generation layers 132 and 152 serve to generate holes. Meanwhile, an electron injecting layer (EIL) can be further formed between the third electron transporting layer 166 and the second electrode 170.

The organic light-emitting diode display device 100 according to the first embodiment of the present disclosure emit light using a plurality of stacks ST1, ST2, and ST3 including a plurality of luminous materials having photoluminescence peaks of different wavelengths instead of emitting light using a single stack including one luminous material, and white light is emitted by combining light from the plurality of stacks ST1, ST2, and ST3.

Here, the plurality of stacks ST1, ST2, and ST3 can include a stack having a fluorescence compound or a stack having a phosphorescence compound as a luminous body. At this time, it is beneficial that adjacent emitting material layers in each stack ST1, ST2, and ST3 have the same light-emitting mechanism. Namely, the first and second yellow-green emitting material layers 142 and 144 of the second stack ST2 adjacent to each other have the same light-emitting mechanism, and the red emitting material layer 168 and the second blue emitting material layer 164 of the third stack ST3 adjacent to each other have the same light-emitting mechanism.

In this case, the red emitting material layer 168 and the second blue emitting material layer 164 each include a phosphorescence compound as a luminous body. In addition, the first and second yellow-green emitting material layers 142 and 144 each can include a phosphorescence compound as a luminous body.

Meanwhile, the first blue emitting material layer 124 of the first stack ST1 can include a phosphorescence compound or a fluorescence compound as a luminous body. The first stack ST1 may be formed without a red emitting material layer.

More specifically, each of the red emitting material layer 168, the first and second blue emitting material layers 124 and 164, and the first and second yellow-green material layers 142 and 144 includes a host and a dopant of the luminous body. The host includes an H-type (hole-type) host (or a P-type (positive-type) host) and an E-type (electron-type) host (or an N-type (negative-type) host).

In the present disclosure, each of the red emitting material layer 168 and the second blue emitting material layer 164 adjacent to each other includes a phosphorescence dopant. That is, the dopant of each of the red emitting material layer 168 and the second blue emitting material layer 164 includes a phosphorescence compound that emits light by energy transition from the lowest triplet excited state T1 to the ground state S0. At this time, the T1 energy of the host of the second blue emitting material layer 164 is higher than the T1 energy of the dopant of the red emitting material layer 168, and beneficially, a difference between the T1 energy of the host of the second blue emitting material layer 164 and the T1 energy of the dopant of the red emitting material layer 168 is about 0.2 eV to about 1.2 eV.

In the red emitting material layer 168, it is desirable that a content of the dopant based on the host, that is, a doping concentration is 1 to 5 Vol % and the ratio of the H-type host to the content of the host material in the red emitting material layer 168 is equal to or greater than the ratio of the E-type host to the content of the host material in the red emitting material layer 168. For example, the ratio of the H-type host can be 50 to 80 Vol %. A thickness of the red emitting material layer 168 can be 50 Å to 100 Å, but is not limited thereto.

Further, the first and second yellow-green emitting material layers 142 and 144 each can include a phosphorescence dopant. That is, the dopant of each of the first and second yellow-green emitting material layers 142 and 144 can include a phosphorescence compound. Here, a content of the dopant of the first yellow-green emitting material layer 142 is greater than a content of the dopant of the second yellow-green emitting material layer 144. For example, the content of the dopant of the first yellow-green emitting material layer 142 based on the host, that is, a doping concentration can be 15 to 30 Vol %, and the content of the dopant of the second yellow-green emitting material layer 144, that is, a doping concentration can be 10 to 25 Vol %.

Meanwhile, a green emitting material layer can be used instead of the second yellow-green emitting material layer 144. In this case, the second stack ST2 emits yellow-green light and green light. Here, a content of a dopant of the green emitting material layer based on a host, that is, a doping concentration can be 1 to 5 Vol %.

In the organic light-emitting diode display device 100 according to the first embodiment of the present disclosure, even when applied to a high-definition small display device, instead of forming red, green and blue light-emitting layers for respective sub-pixels, one white light-emitting layer is formed on the entire surface of the substrate, thereby preventing a decrease in yield.

At this time, since each stack ST1, ST2, and ST3 is configured to include one or two emitting material layers, it is easy to control a charge balance, which is advantageous in a manufacturing process.

Further, the red emitting material layer 168 and the second blue emitting material layer 164 adjacent to each other are configured to include the phosphorescence dopant, and it is possible to increase the luminous efficiency compared to the configuration including the fluorescence dopant.

Figure 3:
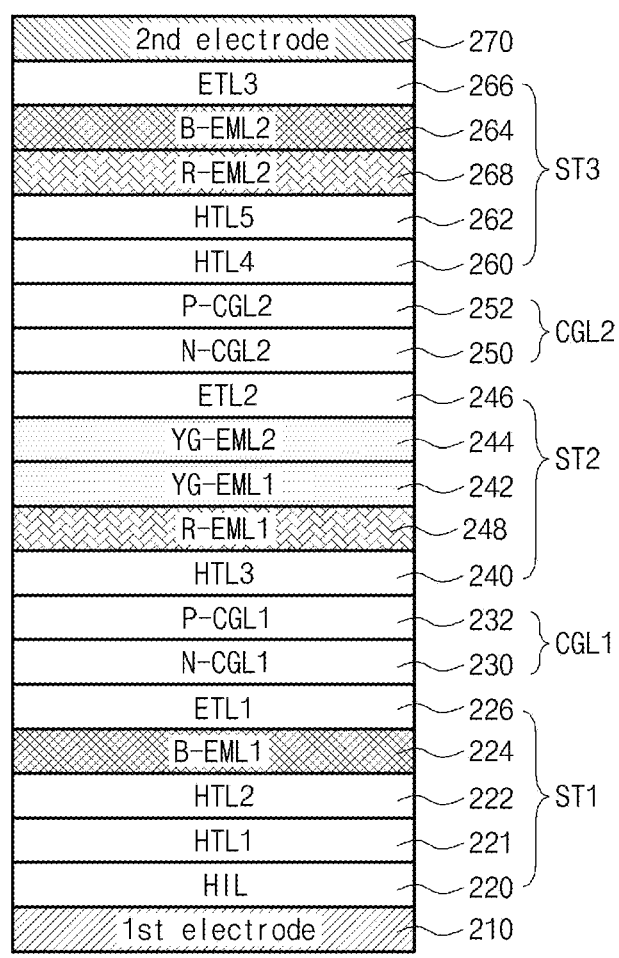
FIG. 3 is a schematic view of an organic light-emitting diode display device according to a second embodiment of the present disclosure.

FIG. 3 is a schematic view of an organic light-emitting diode display device according to a second embodiment of the present disclosure.

In FIG. 3, the organic light-emitting diode display device 200 according to the second embodiment of the present disclosure includes a first electrode 210, a first stack ST1, a first charge generation layer CGL1, a second stack ST2, a second charge generation layer CGL2, a third stack ST3, and a second electrode 270.

Here, the first stack ST1 emits blue light, the second stack ST2 emits yellow-green light and green light, and the third stack ST3 emits blue light and red light.

The first electrode 210 and the second electrode 270 can be an anode and a cathode, respectively. The first electrode 210 is formed of a conductive material having relatively high work function. For example, the first electrode 210 can be formed of a transparent conductive material such as indium tin oxide (ITO) or indium zinc oxide (IZO). On the other hand, the second electrode 270 is formed of a conductive material having relatively low work function. For example, the second electrode 270 can be formed of a metal material such as aluminum (Al), magnesium (Mg), silver (Ag), gold (Au), or their alloy.

The first stack ST1 for emitting blue light includes a hole injecting layer (HIL) 220, a first hole transporting layer (HTL1) 221, a second hole transporting layer (HTL2) 222, a first blue emitting material layer (B-EML1) 224, and a first electron transporting layer (ETL1) 226 sequentially from bottom.

The first charge generation layer CGL1 includes a first N-type charge generation layer (N-CGL1) 230 as a lower layer and a first P-type charge generation layer (P-CGL1) 232 as an upper layer. The first N-type charge generation layer 230 is disposed between the first electron transporting layer 226 of the first stack ST1 and the first P-type charge generation layer 232.

The second stack ST2 for emitting yellow-green light and red light includes a third hole transporting layer (HTL3) 240, a first red emitting material layer (R-EML1) 248, a first yellow-green emitting material layer (YG-EML1) 242, a second yellow-green emitting material layer (YG-EML2) 244, and a second electron transporting layer (ETL2) 246 sequentially from bottom.

The second charge generation layer CGL2 includes a second N-type charge generation layer (N-CGL2) 250 as a lower layer and a second P-type charge generation layer (P-CGL2) 252 as an upper layer. The second N-type charge generation layer 250 is disposed between the second electron transporting layer 246 of the second stack ST2 and the second P-type charge generation layer 252.

The third stack ST3 for emitting blue light and red light includes a fourth hole transporting layer (HTL4) 260, a fifth hole transporting layer (HTL5) 262, a second red emitting material layer (R-EML2) 268, a second blue emitting material layer (B-EML2) 264, and a third electron transporting layer (ETL3) 266 sequentially from bottom.

A total thickness of the first, second, and third stacks ST1, ST2, and ST3 and the first and second charge generation layers CGL1 and CGL2, that is, a distance between the first electrode 210 and the second electrode 270 can be about 4,000 Å to about 4,500 Å, but is not limited thereto.

Although not shown in the figure, the organic light-emitting diode display device 200 of the present disclosure can include a substrate comprising a plurality of sub-pixels expressing red, green and blue colors, the first electrode 210 can be disposed in each sub-pixel over the substrate, and the second electrode 270 can be disposed substantially all over the substrate.

In addition, a plurality of thin film transistors can be disposed under the first electrode 210 in each sub-pixel, and the first electrode 210 can be connected to a driving thin film transistor among the plurality of thin film transistors.

Further, a color filter layer and/or a color conversion layer can be disposed under the first electrode 210 or over the second electrode 270 corresponding to each sub-pixel.

The hole injecting layer 220 serves to inject holes, the first, second, third, fourth, and fifth hole transporting layers 221, 222, 240, 260, and 262 serve to transport holes, the first, second, and third electron transporting layers 226, 246, and 266 serve to transport electrons, the first and second N-type charge generation layers 230 and 250 serve to generate electrons, and the first and second P-type charge generation layers 232 and 252 serve to generate holes. Meanwhile, an electron injecting layer (EIL) can be further formed between the third electron transporting layer 266 and the second electrode 270.

The organic light-emitting diode display device 200 according to the second embodiment of the present disclosure emit light using a plurality of stacks ST1, ST2, and ST3 including a plurality of luminous materials having photoluminescence peaks of different wavelengths instead of emitting light using a single stack including one luminous material, and white light is emitted by combining light from the plurality of stacks ST1, ST2, and ST3.

Here, the plurality of stacks ST1, ST2, and ST3 can include a stack having a fluorescence compound or a stack having a phosphorescence compound as a luminous body. At this time, it is beneficial that adjacent emitting material layers in each stack ST1, ST2, and ST3 have the same light-emitting mechanism. Namely, the first red emitting material layer 248 and the first and second yellow-green emitting material layers 242 and 244 of the second stack ST2 adjacent to each other have the same light-emitting mechanism, and the second red emitting material layer 268 and the second blue emitting material layer 264 of the third stack ST3 adjacent to each other have the same light-emitting mechanism.

In this case, the second red emitting material layer 268 and the second blue emitting material layer 264 each include a phosphorescence compound as a luminous body. In addition, the first and second yellow-green emitting material layers 242 and 244 each can include a phosphorescence compound as a luminous body.

Meanwhile, the first blue emitting material layer 224 of the first stack ST1 can include a phosphorescence compound or a fluorescence compound as a luminous body. The first stack ST1 may be formed without a red emitting material layer.

More specifically, each of the first and second red emitting material layers 248 and 268, the first and second blue emitting material layers 224 and 264, and the first and second yellow-green material layers 242 and 244 includes a host and a dopant of the luminous body. The host includes an H-type host (or a P-type host) and an E-type host (or an N-type host).

In the present disclosure, each of the second red emitting material layer 268 and the second blue emitting material layer 264 adjacent to each other includes a phosphorescence dopant. That is, the dopant of each of the second red emitting material layer 268 and the second blue emitting material layer 264 includes a phosphorescence compound that emits light by energy transition from the lowest triplet excited state T1 to the ground state S0. At this time, the T1 energy of the host of the second blue emitting material layer 264 is higher than the T1 energy of the dopant of the second red emitting material layer 268, and beneficially, a difference between the T1 energy of the host of the second blue emitting material layer 264 and the T1 energy of the dopant of the second red emitting material layer 268 is about 0.2 eV to about 1.2 eV. The host and dopant of the second blue emitting material layer 264 may include similar materials described in conjunction with the second blue emitting material layer 164, and the host and dopant of the second red emitting material layer 268 may include similar materials described in conjunction with the red emitting material layer 168.

In the second red emitting material layer 268, it is desirable that a content of the dopant based on the host, that is, a doping concentration is 1 to 5 Vol % and the ratio of the H-type host is equal to or greater than the ratio of the E-type host. For example, the ratio of the H-type host can be 50 to 80 Vol %. A thickness of the second red emitting material layer 268 can be 50 Å to 100 Å, but is not limited thereto.

Further, the first red emitting material layer 248 and the first and second yellow-green emitting material layers 242 and 244 each can include a phosphorescence dopant. That is, the dopant of each of the first red emitting material layer 248 and the first and second yellow-green emitting material layers 242 and 244 can include a phosphorescence compound.

Here, a content of the dopant of the first yellow-green emitting material layer 242 is greater than a content of the dopant of the second yellow-green emitting material layer 244. For example, the content of the dopant of the first yellow-green emitting material layer 242 based on the host, that is, a doping concentration can be 15 to 30 Vol %, and the content of the dopant of the second yellow-green emitting material layer 244, that is, a doping concentration can be 10 to 25 Vol %. The first yellow-green emitting material layer 242 may include similar materials described in conjunction with the first yellow-green emitting material layer 142, and the second yellow-green emitting material layer 244 may include similar materials described in conjunction with the second yellow-green emitting material layer 144.

Additionally, in the first red emitting material layer 248, it is desirable that a content of the dopant based on the host, that is, a doping concentration is 1 to 5 Vol % and the ratio of the H-type host is equal to or greater than the ratio of the E-type host. For example, the ratio of the H-type host can be 50 to 80 Vol %. A thickness of the first red emitting material layer 248 can be 50 Å to 100 Å, but is not limited thereto.

Meanwhile, a green emitting material layer can be used instead of the second yellow-green emitting material layer 244. In this case, the second stack ST2 emits yellow-green light and green light. Here, a content of a dopant of the green emitting material layer based on a host, that is, a doping concentration can be 1 to 5 Vol %.

In the organic light-emitting diode display device 200 according to the second embodiment of the present disclosure, even when applied to a high-definition small display device, instead of forming red, green and blue light-emitting layers for respective sub-pixels, one white light-emitting layer is formed on the entire surface of the substrate, thereby preventing a decrease in yield.

In addition, the second red emitting material layer 268 and the second blue emitting material layer 264 adjacent to each other are configured to include the phosphorescence dopant, and it is possible to increase the luminous efficiency compared to the configuration including the fluorescence dopant.

Further, in the organic light-emitting diode display device 200 according to the second embodiment of the present disclosure, since the second and third stacks ST2 and ST3 include the first and second red emitting material layers 248 and 268, respectively, it is possible to increase the efficiency of red light compared to the first embodiment in which only the third stack ST3 includes the red emitting material layer.

Figure 4:
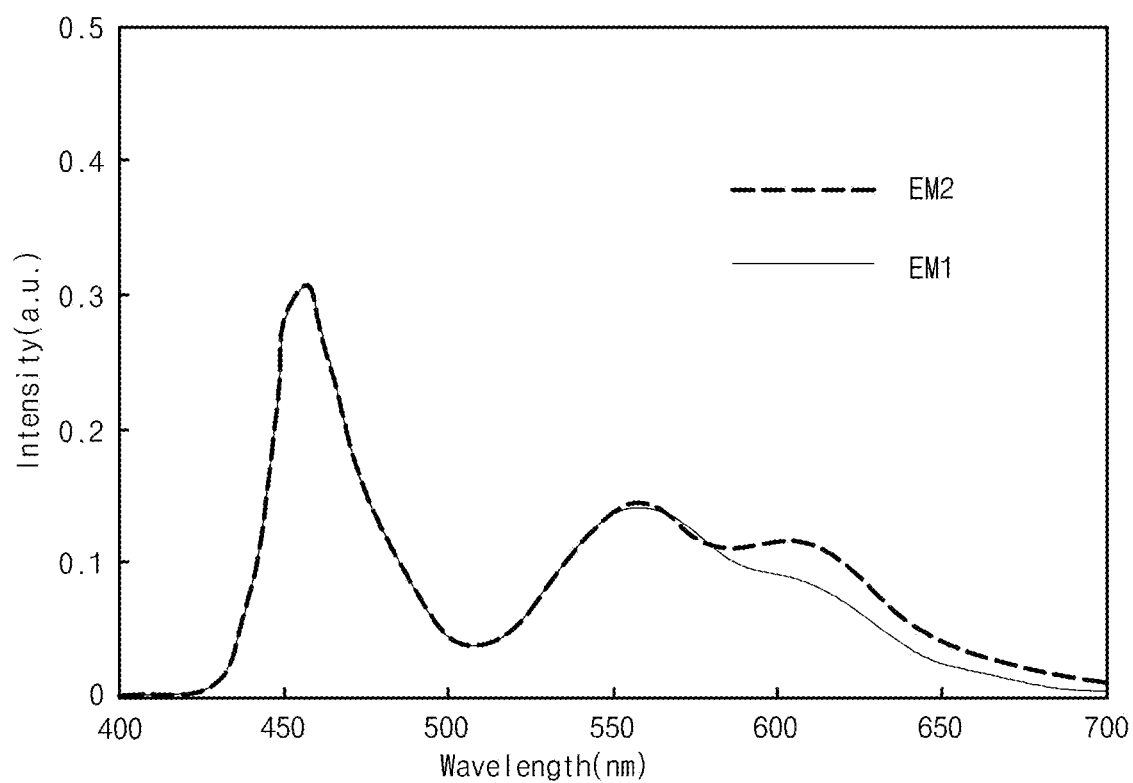
FIG. 4 is a graph showing the emission spectrum of the organic light-emitting diode display device according to the second embodiment of the present disclosure.

FIG. 4 is a graph showing the emission spectrum of an example organic light-emitting diode display device according to the second embodiment of the present disclosure and shows the emission spectrum of an example organic light-emitting diode display device according to the first embodiment.

In FIG. 4, it can be seen that the intensity of red light of the second embodiment EM2 increases compared to the first embodiment EM1. Accordingly, the efficiency of red light of the second embodiment EM2 increases compared to the first embodiment EM1.

Figure 5:
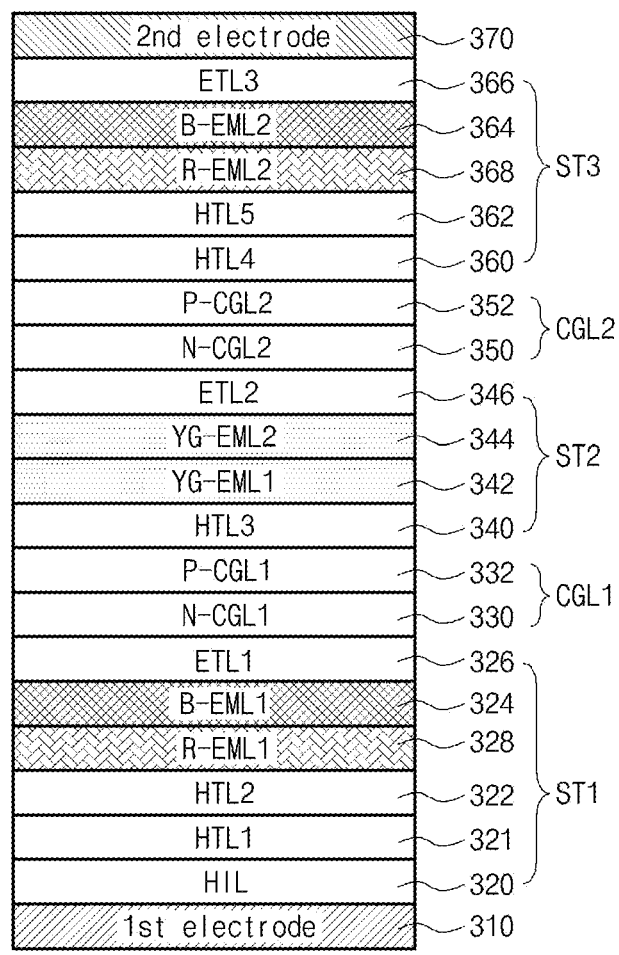
FIG. 5 is a schematic view of an organic light-emitting diode display device according to a third embodiment of the present disclosure.

FIG. 5 is a schematic view of an organic light-emitting diode display device according to a third embodiment of the present disclosure.

In FIG. 5, the organic light-emitting diode display device 300 according to the third embodiment of the present disclosure includes a first electrode 310, a first stack ST1, a first charge generation layer CGL1, a second stack ST2, a second charge generation layer CGL2, a third stack ST3, and a second electrode 370.

Here, the first stack ST1 emits blue light and red light, the second stack ST2 emits yellow-green light, and the third stack ST3 emits blue light and red light.

The first electrode 310 and the second electrode 370 can be an anode and a cathode, respectively. The first electrode 310 is formed of a conductive material having relatively high work function. For example, the first electrode 310 can be formed of a transparent conductive material such as indium tin oxide (ITO) or indium zinc oxide (IZO). On the other hand, the second electrode 370 is formed of a conductive material having relatively low work function. For example, the second electrode 370 can be formed of a metal material such as aluminum (Al), magnesium (Mg), silver (Ag), gold (Au), or their alloy.

The first stack ST1 for emitting blue light and red light includes a hole injecting layer (HIL) 320, a first hole transporting layer (HTL1) 321, a second hole transporting layer (HTL2) 322, a first red emitting material layer (R-EML1) 328, a first blue emitting material layer (B-EML1) 324, and a first electron transporting layer (ETL1) 326 sequentially from bottom.

The first charge generation layer CGL1 includes a first N-type charge generation layer (N-CGL1) 330 as a lower layer and a first P-type charge generation layer (P-CGL1) 332 as an upper layer. The first N-type charge generation layer 330 is disposed between the first electron transporting layer 326 of the first stack ST1 and the first P-type charge generation layer 332.

The second stack ST2 for emitting yellow-green light includes a third hole transporting layer (HTL3) 340, a first yellow-green emitting material layer (YG-EML1) 342, a second yellow-green emitting material layer (YG-EML2) 344, and a second electron transporting layer (ETL2) 346 sequentially from bottom.

The second charge generation layer CGL2 includes a second N-type charge generation layer (N-CGL2) 350 as a lower layer and a second P-type charge generation layer (P-CGL2) 352 as an upper layer. The second N-type charge generation layer 350 is disposed between the second electron transporting layer 346 of the second stack ST2 and the second P-type charge generation layer 352.

The third stack ST3 for emitting blue light and red light includes a fourth hole transporting layer (HTL4) 360, a fifth hole transporting layer (HTL5) 362, a second red emitting material layer (R-EML2) 368, a second blue emitting material layer (B-EML2) 364, and a third electron transporting layer (ETL3) 366 sequentially from bottom.

A total thickness of the first, second, and third stacks ST1, ST2, and ST3 and the first and second charge generation layers CGL1 and CGL2, that is, a distance between the first electrode 310 and the second electrode 370 can be about 4,000 Å to about 4,500 Å, but is not limited thereto.

Although not shown in the figure, the organic light-emitting diode display device 300 of the present disclosure can include a substrate comprising a plurality of sub-pixels expressing red, green and blue colors, the first electrode 310 can be disposed in each sub-pixel over the substrate, and the second electrode 370 can be disposed substantially all over the substrate.

In addition, a plurality of thin film transistors can be disposed under the first electrode 310 in each sub-pixel, and the first electrode 310 can be connected to a driving thin film transistor among the plurality of thin film transistors.

Further, a color filter layer and/or a color conversion layer can be disposed under the first electrode 310 or over the second electrode 370 corresponding to each sub-pixel.

The hole injecting layer 320 serves to inject holes, the first, second, third, fourth, and fifth hole transporting layers 321, 322, 340, 360, and 362 serve to transport holes, the first, second, and third electron transporting layers 326, 346, and 366 serve to transport electrons, the first and second N-type charge generation layers 330 and 350 serve to generate electrons, and the first and second P-type charge generation layers 332 and 352 serve to generate holes. Meanwhile, an electron injecting layer (EIL) can be further formed between the third electron transporting layer 366 and the second electrode 370.

The organic light-emitting diode display device 300 according to the third embodiment of the present disclosure emit light using a plurality of stacks ST1, ST2, and ST3 including a plurality of luminous materials having photoluminescence peaks of different wavelengths instead of emitting light using a single stack including one luminous material, and white light is emitted by combining light from the plurality of stacks ST1, ST2, and ST3.

Here, the plurality of stacks ST1, ST2, and ST3 can include a stack having a fluorescence compound or a stack having a phosphorescence compound as a luminous body. At this time, it is beneficial that adjacent emitting material layers in each stack ST1, ST2, and ST3 have the same light-emitting mechanism. Namely, the first red emitting material layer 328 and the first blue emitting material layer 324 of the first stack ST1 adjacent to each other have the same light-emitting mechanism, the first and second yellow-green emitting material layers 342 and 344 of the second stack ST2 adjacent to each other have the same light-emitting mechanism, and the second red emitting material layer 368 and the second blue emitting material layer 364 of the third stack ST3 adjacent to each other have the same light-emitting mechanism.

In this case, the first red emitting material layer 328, the first blue emitting material layer 324, the second red emitting material layer 368, and the second blue emitting material layer 364 each include a phosphorescence compound as a luminous body. In addition, the first and second yellow-green emitting material layers 342 and 344 each can include a phosphorescence compound as a luminous body.

More specifically, each of the first and second red emitting material layers 328 and 368, the first and second blue emitting material layers 324 and 364, and the first and second yellow-green material layers 342 and 344 includes a host and a dopant of the luminous body. The host includes an H-type host (or a P-type host) and an E-type host (or an N-type host).

In the present disclosure, each of the first red emitting material layer 328 and the first blue emitting material layer 324 adjacent to each other includes a phosphorescence dopant. That is, the dopant of each of the first red emitting material layer 328 and the first blue emitting material layer 324 includes a phosphorescence compound that emits light by energy transition from the lowest triplet excited state T1 to the ground state S0. At this time, the T1 energy of the host of the first blue emitting material layer 324 is higher than the T1 energy of the dopant of the first red emitting material layer 328, and beneficially, a difference between the T1 energy of the host of the first blue emitting material layer 324 and the T1 energy of the dopant of the first red emitting material layer 328 is about 0.2 eV to about 1.2 eV. The host and dopant of the first blue emitting material layer 324 may include similar materials described in conjunction with the second blue emitting material layer 164, and the host and dopant of the first red emitting material layer 328 may include similar materials described in conjunction with the red emitting material layer 168.

In the first red emitting material layer 328, it is desirable that a content of the dopant based on the host, that is, a doping concentration is 1 to 5 Vol % and the ratio of the H-type host is equal to or greater than the ratio of the E-type host. For example, the ratio of the H-type host can be 50 to 80 Vol %. A thickness of the first red emitting material layer 328 can be 50 Å to 100 Å, but is not limited thereto.

Further, each of the second red emitting material layer 368 and the second blue emitting material layer 364 adjacent to each other includes a phosphorescence dopant. That is, the dopant of each of the second red emitting material layer 368 and the second blue emitting material layer 364 includes a phosphorescence compound that emits light by energy transition from the lowest triplet excited state T1 to the ground state S0. At this time, the T1 energy of the host of the second blue emitting material layer 364 is higher than the T1 energy of the dopant of the second red emitting material layer 368, and beneficially, a difference between the T1 energy of the host of the second blue emitting material layer 364 and the T1 energy of the dopant of the second red emitting material layer 368 is about 0.2 eV to about 1.2 eV. The host and dopant of the second blue emitting material layer 364 may include similar materials described in conjunction with the second blue emitting material layer 164, and the host and dopant of the second red emitting material layer 368 may include similar materials described in conjunction with the red emitting material layer 168.

In the second red emitting material layer 368, it is desirable that a content of the dopant based on the host, that is, a doping concentration is 1 to 5 Vol % and the ratio of the H-type host is equal to or greater than the ratio of the E-type host. For example, the ratio of the H-type host can be 50 to 80 Vol %. A thickness of the second red emitting material layer 368 can be 50 Å to 100 Å, but is not limited thereto.

In addition, the first and second yellow-green emitting material layers 342 and 344 each can include a phosphorescence dopant. That is, the dopant of each of the first and second yellow-green emitting material layers 342 and 344 can include a phosphorescence compound.

Here, a content of the dopant of the first yellow-green emitting material layer 342 is greater than a content of the dopant of the second yellow-green emitting material layer 344. For example, the content of the dopant of the first yellow-green emitting material layer 342 based on the host, that is, a doping concentration can be 15 to 30 Vol %, and the content of the dopant of the second yellow-green emitting material layer 344, that is, a doping concentration can be 10 to 25 Vol %. The first yellow-green emitting material layer 342 may include similar materials described in conjunction with the first yellow-green emitting material layer 142, and the second yellow-green emitting material layer 344 may include similar materials described in conjunction with the second yellow-green emitting material layer 144.

Meanwhile, a green emitting material layer can be used instead of the second yellow-green emitting material layer 344. In this case, the second stack ST2 emits yellow-green light and green light. Here, a content of a dopant of the green emitting material layer based on a host, that is, a doping concentration can be 1 to 5 Vol %.

In the organic light-emitting diode display device 300 according to the third embodiment of the present disclosure, even when applied to a high-definition small display device, instead of forming red, green and blue light-emitting layers for respective sub-pixels, one white light-emitting layer is formed on the entire surface of the substrate, thereby preventing a decrease in yield.

At this time, since each stack ST1, ST2, and ST3 is configured to include two emitting material layers, it is easy to control a charge balance, which is advantageous in a manufacturing process.

In addition, the first red emitting material layer 328 and the first blue emitting material layer 324 adjacent to each other and the second red emitting material layer 368 and the second blue emitting material layer 364 adjacent to each other are configured to include the phosphorescence dopant, and it is possible to increase the luminous efficiency compared to the configuration including the fluorescence dopant.

Further, in the organic light-emitting diode display device 300 according to the third embodiment of the present disclosure, since the first and third stacks ST1 and ST3 include the first and second red emitting material layers 328 and 368, respectively, it is possible to increase the efficiency of red light compared to the first embodiment in which only the third stack ST3 includes the red emitting material layer.

Figure 6:
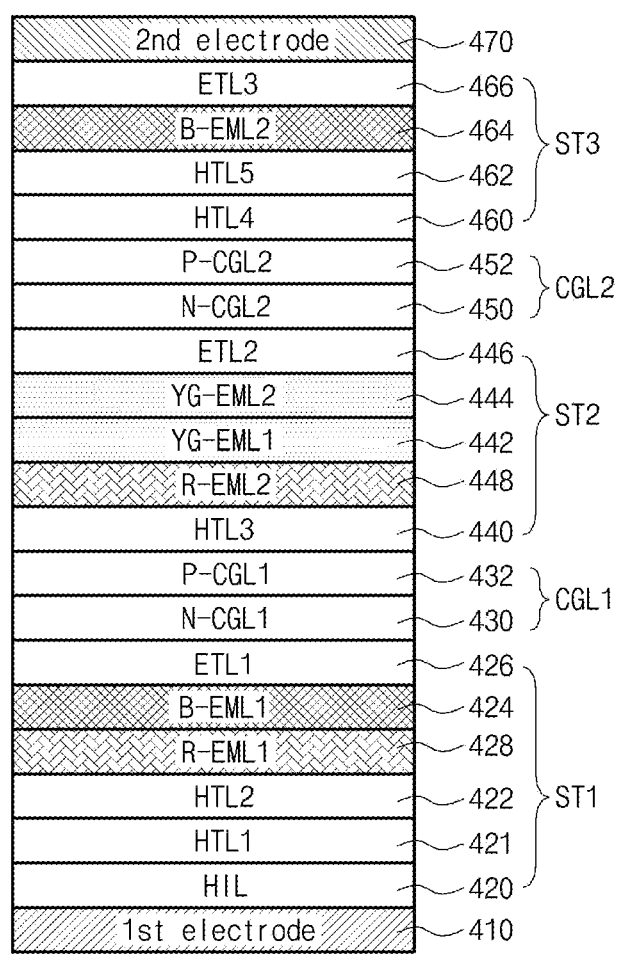
FIG. 6 is a schematic view of an organic light-emitting diode display device according to a fourth embodiment of the present disclosure.

FIG. 6 is a schematic view of an organic light-emitting diode display device according to a fourth embodiment of the present disclosure.

In FIG. 6, the organic light-emitting diode display device 400 according to the fourth embodiment of the present disclosure includes a first electrode 410, a first stack ST1, a first charge generation layer CGL1, a second stack ST2, a second charge generation layer CGL2, a third stack ST3, and a second electrode 470.

Here, the first stack ST1 emits blue light and red light, the second stack ST2 emits yellow-green light and red light, and the third stack ST3 emits blue light.

The first electrode 410 and the second electrode 470 can be an anode and a cathode, respectively. The first electrode 410 is formed of a conductive material having relatively high work function. For example, the first electrode 410 can be formed of a transparent conductive material such as indium tin oxide (ITO) or indium zinc oxide (IZO). On the other hand, the second electrode 470 is formed of a conductive material having relatively low work function. For example, the second electrode 470 can be formed of a metal material such as aluminum (Al), magnesium (Mg), silver (Ag), gold (Au), or their alloy.

The first stack ST1 for emitting blue light and red light includes a hole injecting layer (HIL) 420, a first hole transporting layer (HTL1) 421, a second hole transporting layer (HTL2) 422, a first red emitting material layer (R-EML1) 428, a first blue emitting material layer (B-EML1) 424, and a first electron transporting layer (ETL1) 426 sequentially from bottom.

The first charge generation layer CGL1 includes a first N-type charge generation layer (N-CGL1) 430 as a lower layer and a first P-type charge generation layer (P-CGL1) 432 as an upper layer. The first N-type charge generation layer 430 is disposed between the first electron transporting layer 426 of the first stack ST1 and the first P-type charge generation layer 432.

The second stack ST2 for emitting yellow-green light and red light includes a third hole transporting layer (HTL3) 440, a second red emitting material layer (R-EML2) 448, a first yellow-green emitting material layer (YG-EML1) 442, a second yellow-green emitting material layer (YG-EML2) 444, and a second electron transporting layer (ETL2) 446 sequentially from bottom.

The second charge generation layer CGL2 includes a second N-type charge generation layer (N-CGL2) 450 as a lower layer and a second P-type charge generation layer (P-CGL2) 452 as an upper layer. The second N-type charge generation layer 450 is disposed between the second electron transporting layer 446 of the second stack ST2 and the second P-type charge generation layer 452.

The third stack ST3 for emitting blue light includes a fourth hole transporting layer (HTL4) 460, a fifth hole transporting layer (HTL5) 462, a second blue emitting material layer (B-EML2) 464, and a third electron transporting layer (ETL3) 466 sequentially from bottom.

A total thickness of the first, second, and third stacks ST1, ST2, and ST3 and the first and second charge generation layers CGL1 and CGL2, that is, a distance between the first electrode 410 and the second electrode 470 can be about 4,000 Å to about 4,500 Å, but is not limited thereto.

Although not shown in the figure, the organic light-emitting diode display device 400 of the present disclosure can include a substrate comprising a plurality of sub-pixels expressing red, green and blue colors, the first electrode 410 can be disposed in each sub-pixel over the substrate, and the second electrode 470 can be disposed substantially all over the substrate.

In addition, a plurality of thin film transistors can be disposed under the first electrode 410 in each sub-pixel, and the first electrode 410 can be connected to a driving thin film transistor among the plurality of thin film transistors.

Further, a color filter layer and/or a color conversion layer can be disposed under the first electrode 410 or over the second electrode 470 corresponding to each sub-pixel.

The hole injecting layer 420 serves to inject holes, the first, second, third, fourth, and fifth hole transporting layers 421, 422, 440, 460, and 462 serve to transport holes, the first, second, and third electron transporting layers 426, 446, and 466 serve to transport electrons, the first and second N-type charge generation layers 430 and 450 serve to generate electrons, and the first and second P-type charge generation layers 432 and 452 serve to generate holes. Meanwhile, an electron injecting layer (EIL) can be further formed between the third electron transporting layer 466 and the second electrode 470.

The organic light-emitting diode display device 400 according to the fourth embodiment of the present disclosure emit light using a plurality of stacks ST1, ST2, and ST3 including a plurality of luminous materials having photoluminescence peaks of different wavelengths instead of emitting light using a single stack including one luminous material, and white light is emitted by combining light from the plurality of stacks ST1, ST2, and ST3.

Here, the plurality of stacks ST1, ST2, and ST3 can include a stack having a fluorescence compound or a stack having a phosphorescence compound as a luminous body. At this time, it is beneficial that adjacent emitting material layers in each stack ST1, ST2, and ST3 have the same light-emitting mechanism. Namely, the first red emitting material layer 428 and the first blue emitting material layer 424 of the first stack ST1 adjacent to each other have the same light-emitting mechanism, and the second red emitting material layer 448 and the first and second yellow-green emitting material layers 442 and 444 of the second stack ST2 adjacent to each other have the same light-emitting mechanism.

In this case, the first red emitting material layer 428 and the first blue emitting material layer 424 each include a phosphorescence compound as a luminous body. In addition, the second red emitting material layer 448 and the first and second yellow-green emitting material layers 442 and 444 each can include a phosphorescence compound as a luminous body.

Meanwhile, the second blue emitting material layer 464 of the third stack ST3 can include a phosphorescence compound or a fluorescence compound as a luminous body. The third stack ST3 may be formed without a red emitting material layer.

More specifically, each of the first and second red emitting material layers 428 and 448, the first and second blue emitting material layers 424 and 464, and the first and second yellow-green material layers 442 and 444 includes a host and a dopant of the luminous body. The host includes an H-type host (or a P-type host) and an E-type host (or an N-type host).

In the present disclosure, each of the first red emitting material layer 428 and the first blue emitting material layer 424 adjacent to each other includes a phosphorescence dopant. That is, the dopant of each of the first red emitting material layer 428 and the first blue emitting material layer 424 includes a phosphorescence compound that emits light by energy transition from the lowest triplet excited state T1 to the ground state S0. At this time, the T1 energy of the host of the first blue emitting material layer 424 is higher than the T1 energy of the dopant of the first red emitting material layer 428, and beneficially, a difference between the T1 energy of the host of the first blue emitting material layer 424 and the T1 energy of the dopant of the first red emitting material layer 428 is about 0.2 eV to about 1.2 eV. The host and dopant of the first blue emitting material layer 424 may include similar materials described in conjunction with the second blue emitting material layer 164, and the host and dopant of the first red emitting material layer 428 may include similar materials described in conjunction with the red emitting material layer 168.

In the first red emitting material layer 428, it is desirable that a content of the dopant based on the host, that is, a doping concentration is 1 to 5 Vol % and the ratio of the H-type host is equal to or greater than the ratio of the E-type host. For example, the ratio of the H-type host can be 50 to 80 Vol %. A thickness of the first red emitting material layer 428 can be 50 Å to 100 Å, but is not limited thereto.

Further, the second red emitting material layer 448 and the first and second yellow-green emitting material layers 442 and 444 each can include a phosphorescence dopant. That is, the dopant of each of the second red emitting material layer 448 and the first and second yellow-green emitting material layers 442 and 444 can include a phosphorescence compound.

Here, a content of the dopant of the first yellow-green emitting material layer 442 is greater than a content of the dopant of the second yellow-green emitting material layer 444. For example, the content of the dopant of the first yellow-green emitting material layer 442 based on the host, that is, a doping concentration can be 15 to 30 Vol %, and the content of the dopant of the second yellow-green emitting material layer 444, that is, a doping concentration can be 10 to 25 Vol %. The first yellow-green emitting material layer 442 may include similar materials described in conjunction with the first yellow-green emitting material layer 142, and the second yellow-green emitting material layer 444 may include similar materials described in conjunction with the second yellow-green emitting material layer 144.

Meanwhile, a green emitting material layer can be used instead of the second yellow-green emitting material layer 444. In this case, the second stack ST2 emits yellow-green light and green light. Here, a content of a dopant of the green emitting material layer based on a host, that is, a doping concentration can be 1 to 5 Vol %.

In the organic light-emitting diode display device 400 according to the fourth embodiment of the present disclosure, even when applied to a high-definition small display device, instead of forming red, green and blue light-emitting layers for respective sub-pixels, one white light-emitting layer is formed on the entire surface of the substrate, thereby preventing a decrease in yield.

In addition, the first red emitting material layer 428 and the first blue emitting material layer 424 adjacent to each other are configured to include the phosphorescence dopant, and it is possible to increase the luminous efficiency compared to the configuration including the fluorescence dopant.

Further, in the organic light-emitting diode display device 400 according to the fourth embodiment of the present disclosure, since the first and second stacks ST1 and ST2 include the first and second red emitting material layers 428 and 448, respectively, it is possible to increase the efficiency of red light compared to the first embodiment in which only the third stack ST3 includes the red emitting material layer.

Figure 7:
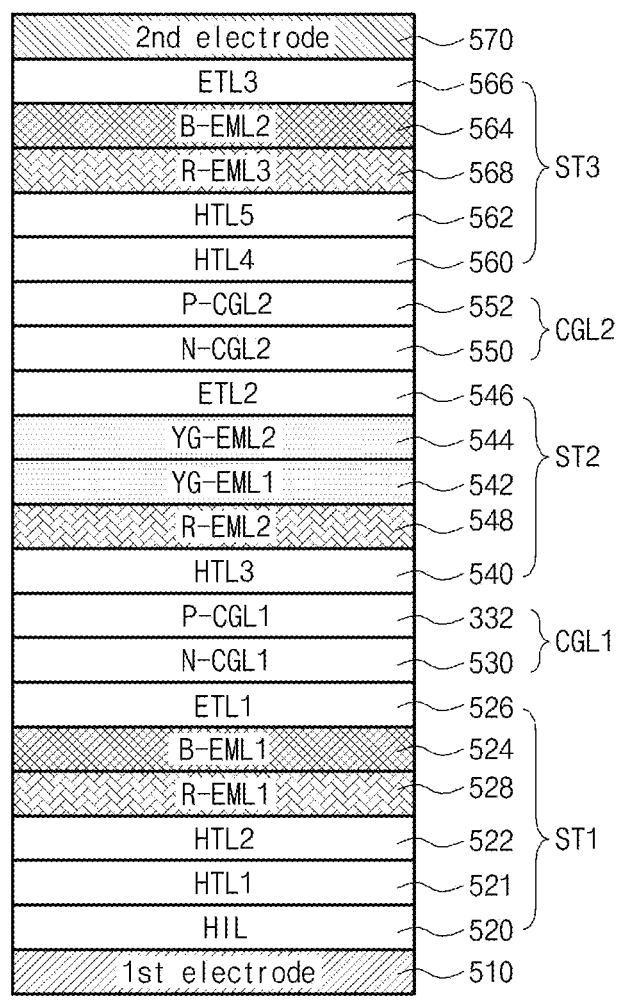
FIG. 7 is a schematic view of an organic light-emitting diode display device according to a fifth embodiment of the present disclosure.

FIG. 7 is a schematic view of an organic light-emitting diode display device according to a fifth embodiment of the present disclosure.

In FIG. 7, the organic light-emitting diode display device 500 according to the fifth embodiment of the present disclosure includes a first electrode 510, a first stack ST1, a first charge generation layer CGL1, a second stack ST2, a second charge generation layer CGL2, a third stack ST3, and a second electrode 570.

Here, the first stack ST1 emits blue light and red light, the second stack ST2 emits yellow-green light and red light, and the third stack ST3 emits blue light and red light.

The first electrode 510 and the second electrode 570 can be an anode and a cathode, respectively. The first electrode

510 is formed of a conductive material having relatively high work function. For example, the first electrode 510 can be formed of a transparent conductive material such as indium tin oxide (ITO) or indium zinc oxide (IZO). On the other hand, the second electrode 570 is formed of a conductive material having relatively low work function. For example, the second electrode 570 can be formed of a metal material such as aluminum (Al), magnesium (Mg), silver (Ag), gold (Au), or their alloy.

The first stack ST1 for emitting blue light and red light includes a hole injecting layer (HIL) 520, a first hole transporting layer (HTL1) 521, a second hole transporting layer (HTL2) 522, a first red emitting material layer (R-EML1) 528, a first blue emitting material layer (B-EML1) 524, and a first electron transporting layer (ETL1) 526 sequentially from bottom.

The first charge generation layer CGL1 includes a first N-type charge generation layer (N-CGL1) 530 as a lower layer and a first P-type charge generation layer (P-CGL1) 532 as an upper layer. The first N-type charge generation layer 530 is disposed between the first electron transporting layer 526 of the first stack ST1 and the first P-type charge generation layer 532.

The second stack ST2 for emitting yellow-green light and red light includes a third hole transporting layer (HTL3) 540, a second red emitting material layer (R-EML2) 548, a first yellow-green emitting material layer (YG-EML1) 542, a second yellow-green emitting material layer (YG-EML2) 544, and a second electron transporting layer (ETL2) 546 sequentially from bottom.

The second charge generation layer CGL2 includes a second N-type charge generation layer (N-CGL2) 550 as a lower layer and a second P-type charge generation layer (P-CGL2) 552 as an upper layer. The second N-type charge generation layer 550 is disposed between the second electron transporting layer 546 of the second stack ST2 and the second P-type charge generation layer 552.

The third stack ST3 for emitting blue light and red light includes a fourth hole transporting layer (HTL4) 560, a fifth hole transporting layer (HTL5) 562, a third red emitting material layer (R-EML3) 568, a second blue emitting material layer (B-EML2) 564, and a third electron transporting layer (ETL3) 566 sequentially from bottom.

A total thickness of the first, second, and third stacks ST1, ST2, and ST3 and the first and second charge generation layers CGL1 and CGL2, that is, a distance between the first electrode 510 and the second electrode 570 can be about 4,000 Å to about 4,500 Å, but is not limited thereto.

Although not shown in the figure, the organic light-emitting diode display device 500 of the present disclosure can include a substrate comprising a plurality of sub-pixels expressing red, green and blue colors, the first electrode 510 can be disposed in each sub-pixel over the substrate, and the second electrode 570 can be disposed substantially all over the substrate.

In addition, a plurality of thin film transistors can be disposed under the first electrode 510 in each sub-pixel, and the first electrode 510 can be connected to a driving thin film transistor among the plurality of thin film transistors.

Further, a color filter layer and/or a color conversion layer can be disposed under the first electrode 510 or over the second electrode 570 corresponding to each sub-pixel.

The hole injecting layer 520 serves to inject holes, the first, second, third, fourth, and fifth hole transporting layers 521, 522, 540, 560, and 562 serve to transport holes, the first, second, and third electron transporting layers 526, 546, and 566 serve to transport electrons, the first and second N-type charge generation layers 530 and 550 serve to generate electrons, and the first and second P-type charge generation layers 432 and 452 serve to generate holes. Meanwhile, an electron injecting layer (EIL) can be further formed between the third electron transporting layer 566 and the second electrode 570.

The organic light-emitting diode display device 500 according to the fifth embodiment of the present disclosure emit light using a plurality of stacks ST1, ST2, and ST3 including a plurality of luminous materials having photoluminescence peaks of different wavelengths instead of emitting light using a single stack including one luminous material, and white light is emitted by combining light from the plurality of stacks ST1, ST2, and ST3.

Here, the plurality of stacks ST1, ST2, and ST3 can include a stack having a fluorescence compound or a stack having a phosphorescence compound as a luminous body. At this time, it is beneficial that adjacent emitting material layers in each stack ST1, ST2, and ST3 have the same light-emitting mechanism. Namely, the first red emitting material layer 528 and the first blue emitting material layer 524 of the first stack ST1 adjacent to each other have the same light-emitting mechanism, the second red emitting material layer 548 and the first and second yellow-green emitting material layers 542 and 544 of the second stack ST2 adjacent to each other have the same light-emitting mechanism, and the third red emitting material layer 568 and the second blue emitting material layer 564 of the third stack ST3 adjacent to each other have the same light-emitting mechanism.

In this case, the first red emitting material layer 528 and the first blue emitting material layer 524, the third red emitting material layer 568, and the second blue emitting material layer 564 each include a phosphorescence compound as a luminous body. In addition, the second red emitting material layer 548 and the first and second yellow-green emitting material layers 542 and 544 each can include a phosphorescence compound as a luminous body.

More specifically, each of the first, second, and red emitting material layers 528, 548, and 568, the first and second blue emitting material layers 524 and 564, and the first and second yellow-green material layers 542 and 544 includes a host and a dopant of the luminous body. The host includes an H-type host (or a P-type host) and an E-type host (or an N-type host).

In the present disclosure, each of the first red emitting material layer 528 and the first blue emitting material layer 524 adjacent to each other includes a phosphorescence dopant. That is, the dopant of each of the first red emitting material layer 528 and the first blue emitting material layer 524 includes a phosphorescence compound that emits light by energy transition from the lowest triplet excited state T1 to the ground state S0. At this time, the T1 energy of the host of the first blue emitting material layer 524 is higher than the T1 energy of the dopant of the first red emitting material layer 528, and beneficially, a difference between the T1 energy of the host of the first blue emitting material layer 524 and the T1 energy of the dopant of the first red emitting material layer 528 is about 0.2 eV to about 1.2 eV. The host and dopant of the first blue emitting material layer 524 may include similar materials described in conjunction with the second blue emitting material layer 164, and the host and dopant of the first red emitting material layer 528 may include similar materials described in conjunction with the red emitting material layer 168.

In the first red emitting material layer 528, it is desirable that a content of the dopant based on the host, that is, a doping concentration is 1 to 5 Vol % and the ratio of the H-type host is equal to or greater than the ratio of the E-type host. For example, the ratio of the H-type host can be 50 to 80 Vol %. A thickness of the first red emitting material layer 528 can be 50 Å to 100 Å, but is not limited thereto.

Further, each of the third red emitting material layer 568 and the second blue emitting material layer 564 adjacent to each other includes a phosphorescence dopant. That is, the dopant of each of the third red emitting material layer 568 and the second blue emitting material layer 564 includes a phosphorescence compound that emits light by energy transition from the lowest triplet excited state T1 to the ground state S0. At this time, the T1 energy of the host of the second blue emitting material layer 564 is higher than the T1 energy of the dopant of the third red emitting material layer 568, and beneficially, a difference between the T1 energy of the host of the second blue emitting material layer 564 and the T1 energy of the dopant of the third red emitting material layer 568 is about 0.2 eV to about 1.2 eV. The host and dopant of the second blue emitting material layer 564 may include similar materials described in conjunction with the second blue emitting material layer 164, and the host and dopant of the third red emitting material layer 568 may include similar materials described in conjunction with the red emitting material layer 168.

In the third red emitting material layer 568, it is desirable that a content of the dopant based on the host, that is, a doping concentration is 1 to 5 Vol % and the ratio of the H-type host is equal to or greater than the ratio of the E-type host. For example, the ratio of the H-type host can be 50 to 80 Vol %. A thickness of the third red emitting material layer 568 can be 50 Å to 100 Å, but is not limited thereto.

In addition, the second red emitting material layer 548 and the first and second yellow-green emitting material layers 542 and 544 each can include a phosphorescence dopant. That is, the dopant of each of the second red emitting material layer 548 and the first and second yellow-green emitting material layers 542 and 544 can include a phosphorescence compound.

Here, a content of the dopant of the first yellow-green emitting material layer 542 is greater than a content of the dopant of the second yellow-green emitting material layer 544. For example, the content of the dopant of the first yellow-green emitting material layer 542 based on the host, that is, a doping concentration can be 15 to 30 Vol %, and the content of the dopant of the second yellow-green emitting material layer 544, that is, a doping concentration can be 10 to 25 Vol %. The first yellow-green emitting material layer 542 may include similar materials described in conjunction with the first yellow-green emitting material layer 142, and the second yellow-green emitting material layer 544 may include similar materials described in conjunction with the second yellow-green emitting material layer 144.

Meanwhile, a green emitting material layer can be used instead of the second yellow-green emitting material layer 544. In this case, the second stack ST2 emits yellow-green light and green light. Here, a content of a dopant of the green emitting material layer based on a host, that is, a doping concentration can be 1 to 5 Vol %.

In the organic light-emitting diode display device 500 according to the fifth embodiment of the present disclosure, even when applied to a high-definition small display device, instead of forming red, green and blue light-emitting layers for respective sub-pixels, one white light-emitting layer is formed on the entire surface of the substrate, thereby preventing a decrease in yield.

In addition, the first red emitting material layer 528 and the first blue emitting material layer 524 adjacent to each other and the third red emitting material layer 568 and the second blue emitting material layer 564 adjacent to each other are configured to include the phosphorescence dopant, and it is possible to increase the luminous efficiency compared to the configuration including the fluorescence dopant.

Further, in the organic light-emitting diode display device 500 according to the fifth embodiment of the present disclosure, since the first, second, and third stacks ST1, ST2, and ST3 include the first, second, and third red emitting material layers 528, 548, and 568, respectively, it is possible to increase the efficiency of red light compared to the first embodiment in which only the third stack ST3 includes the red emitting material layer and the second embodiment in which only two of the first, second, and third stacks ST1, ST2, and ST3 include the red emitting material layers.

As described above, in the present disclosure, since one white light-emitting layer is formed on the entire surface of the substrate, it is possible to prevent a decrease in yield even when applied to a high-definition small display device.

In addition, at least one stack is configured to include a red emitting material layer and a blue emitting material layer adjacent to each other and with a phosphorescence dopant, thereby increasing the luminous efficiency compared to the configuration including a fluorescence dopant.

Moreover, two or more stacks are configured to include a red emitting material layer, and it is possible to further increase the efficiency of red light.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. An organic light-emitting diode display device comprising:
   a first electrode;
   a first stack on the first electrode, including a first light emitting material layer, and emitting at least blue light;
   a first charge generation layer on the first stack;
   a second stack on the first charge generation layer, including a second light emitting material layer, and emitting at least yellow-green light;
   a second charge generation layer on the second stack;
   a third stack on the second charge generation layer, including a third light emitting material layer, and emitting at least blue light; and
   a second electrode on the third stack,
   wherein the third light emitting material layer of and the third stack further emits red light,
   wherein the third light emitting material layer of the third stack includes a first red emitting material layer and a first blue emitting material layer, and
   wherein each of the first red emitting material layer and the first blue emitting material layer includes a host and a dopant, and a triplet excited state T1 energy of the host of the first blue emitting material layer is greater than a T1 energy of the dopant of the first red emitting material layer,
   wherein both the dopant of the first red emitting material layer and the dopant of the first blue emitting material layer are phosphorescent dopants,
   wherein the first blue emitting material layer including the phosphorescent dopant is positioned between the second electrode and the first red emitting material layer including the phosphorescent dopant, and wherein number of layers between the second charge generation layer and the third light emitting material layer is greater than number of layers between the first charge generation layer and the second light emitting material layer and smaller than number of layers between the first electrode and the first light emitting material.

2. The organic light-emitting diode display device of claim 1,
wherein the first stack includes a hole injecting layer, a first hole transporting layer, and a second hole transporting layer between the first electrode and the first light emitting material layer,
wherein the second stack includes a third hole transporting layer between the first charge generation layer and the second light emitting material layer, and
wherein the third stack includes a fourth hole transporting layer and a fifth hole transporting layer between the second charge generation layer and the third light emitting material layer.

3. The organic light-emitting diode display device of claim 1, wherein a difference between the T1 energy of the host of the first blue emitting material layer and the T1 energy of the dopant of the first red emitting material layer is 0.2 eV to 1.2 eV.

4. The organic light-emitting diode display device of claim 1, wherein the host of the first red emitting material layer includes a hole-type (H-type) host and an electron-type (E-type) host, and a ratio of the H-type host is equal to or greater than a ratio of the E-type host in the first red emitting material layer.

5. The organic light-emitting diode display device of claim 4, wherein the ratio of the H-type host in the first red emitting material layer is 50 to 80 Vol %.

6. The organic light-emitting diode display device of claim 1, wherein a thickness of the first red emitting material layer is 50 Å to 100 Å.

7. The organic light-emitting diode display device of claim 1, wherein the first blue emitting material layer is disposed above the first red emitting material layer.

8. The organic light-emitting diode display device of claim 1, wherein the second stack further emits red light, and
wherein the second light emitting material layer of the second stack includes a second red emitting material layer.

9. The organic light-emitting diode display device of claim 1, wherein the first light emitting material layer of the first stack includes a second red emitting material layer and a second blue emitting material layer.

10. The organic light-emitting diode display device of claim 9, wherein the second stack further emits red light, and
wherein the second light emitting material layer of the second stack includes a third red emitting material layer.

11. The organic light-emitting diode display device of claim 1,
wherein the second light emitting material layer of the second stack includes a first yellow-green emitting material layer and a second yellow-green emitting material layer,
wherein the first yellow-green emitting material layer is disposed between the first charge generation layer and the second yellow-green emitting material layer, and
wherein a content of a dopant of the first yellow-green emitting material layer is greater than a content of a dopant of the second yellow-green emitting material layer.

12. The organic light-emitting diode display device of claim 11, wherein the second light emitting material layer of the second stack further includes a second red emitting material layer, and a dopant of the second red emitting material layer, the dopant of the first yellow-green emitting material layer, and the dopant of the second yellow-green emitting material layer are phosphorescent dopants.

13. The organic light-emitting diode display device of claim 1,
wherein the second stack further emits green light,
wherein the second light emitting material layer of the second stack includes a yellow-green emitting material layer and a green emitting material layer, and
wherein the yellow-green emitting material layer is disposed between the first charge generation layer and the green emitting material layer.

14. The organic light-emitting diode display device of claim 1, further comprising a color filter layer or a color conversion layer disposed on the second electrode or disposed under the first electrode.

15. The organic light-emitting diode display device of claim 1, wherein a distance between the first electrode to the second electrode is from 4,000 Å to 4,500 Å.

16. The organic light-emitting diode display device of claim 1,
wherein the first light emitting material layer of the first stack further includes a second red emitting material layer and a second blue emitting material layer, and
wherein each of the second red emitting material layer and the second blue emitting material layer includes a host and a dopant, and both the dopant of the second red emitting material layer and the dopant of the second blue emitting material layer are phosphorescent dopants.

17. The organic light-emitting diode display device of claim 1, wherein the first light emitting material layer of the first stack includes a second red emitting material layer including a phosphorescent dopant and a second blue emitting material layer including a phosphorescent dopant, and
wherein the second red emitting material layer including the phosphorescent dopant is positioned between the first electrode and the second blue emitting material layer including the phosphorescent dopant.

18. The organic light-emitting diode display device of claim 17, wherein the second stack further emits red light,
wherein the second light emitting material layer of the second stack includes a third red emitting material layer including a phosphorescent dopant, and
wherein the first red emitting material layer including the phosphorescent dopant is positioned between the first blue emitting material layer including the phosphorescent dopant and the third red emitting material layer including the phosphorescent dopant.

19. The organic light-emitting diode display device of claim 18,
wherein the second blue emitting material layer including the phosphorescent dopant is positioned between the second red emitting material layer including the phosphorescent dopant and the third red emitting material layer including the phosphorescent dopant.

* * * * *